United States Patent [19]

Kashimoto

[11] Patent Number: 5,693,978
[45] Date of Patent: Dec. 2, 1997

[54] RESET SIGNAL OUTPUT CIRCUIT AND SEMICONDUCTOR INTEGRATED CIRCUIT DEVICE

[75] Inventor: Koji Kashimoto, Itami, Japan

[73] Assignee: Mitsubishi Denki Kabushiki Kaisha, Tokyo, Japan

[21] Appl. No.: 811,958

[22] Filed: Mar. 5, 1997

Related U.S. Application Data

[63] Continuation of Ser. No. 309,895, Sep. 20, 1994, abandoned.

[30] Foreign Application Priority Data

Oct. 18, 1993 [JP] Japan ................. 5-260200

[51] Int. Cl.⁶ .............. H01L 27/082; H01L 27/102; H01L 29/70; H01L 31/11
[52] U.S. Cl. .............. 257/574; 257/575; 326/124
[58] Field of Search ................. 257/574, 575; 326/124

[56] References Cited

U.S. PATENT DOCUMENTS

| | | | |
|---|---|---|---|
| 3,961,351 | 6/1976 | Blatt | 257/574 |
| 3,986,199 | 10/1976 | Williams | |
| 4,144,098 | 3/1979 | Roesner | 257/574 |
| 4,160,173 | 7/1979 | Aoki | 257/574 |
| 4,225,854 | 9/1980 | Davis et al. | 257/574 |
| 4,841,484 | 6/1989 | Watanabe et al. | |

*Primary Examiner*—Stephen Meier
*Attorney, Agent, or Firm*—Oblon, Spivak, McClelland, Maier & Neustadt, P.C.

[57] ABSTRACT

A logic circuit (3) comprises IIL aggregates (4a, 4b, 4c) each consisting of a plurality of IIL elements. Each of the IIL aggregates (4a, 4b, 4c) is supplied with an injector current ($I_{inj}$) from an injector current source (2) through a wiring (5). A monitoring element (6) is formed by utilizing an IIL element which needs the longest time until the injector current therein attains a predetermined value. When the injector current applied to an injector current input end (9) attains the predetermined value, potentials of an output terminal (10) and a reset signal input terminal (7) fall. Therefore, a reset operation is performed in accordance with the IIL element which needs the longest time until the injector current attains the predetermined value.

8 Claims, 20 Drawing Sheets

RESET SIGNAL OUTPUT CIRCUIT AND SEMICONDUCTOR INTEGRATED CIRCUIT DEVICE

This application is continuation of application a Ser. No. 08/309,895, filed on Sep. 20, 1994, now abandoned.

BACKGROUND OF THE INVENTION

1. Field of the Invention

The present invention relates in general to a technique for resetting a logic circuit of IIL configuration, and more particularly to a technique for performing a self-reset on starting.

2. Description of the Background Art

FIG. 21 is a block diagram illustrating a technique for starting a logic circuit 3 of IIL (Integrated Injection Logic) configuration. The logic circuit 3 is connected through a wiring 5 to an injector current source 2 which supplies a source injector current $I_{inj}$ thereto and connected through a reset signal input terminal 7 to a reset signal generating circuit 40 which applies a reset signal thereto. The reset signal generating circuit 40 is connected through a wiring 32 to the injector current source 2 which supplies a current thereto. These elements are all provided on the same IC.

FIG. 22 shows waveform charts of respective waveforms of the elements shown in FIG. 21. The waveform A is a waveform of a start signal applied to a start signal input terminal 1 which is connected to the injector current source 2. The waveform B shows the source injector current $I_{inj}$. Since the injector current source 2 supplies the source injector current $I_{inj}$ to the wiring 5 when it receives the start signal, the waveform B starts to rise toward a predetermined value with a rise of the waveform A. Furthermore, the logic circuit 3 is connected to the injector current source 2 as a load of the source injector current $I_{inj}$, and therefore the waveform B rises not sharply but slow.

The injector current source 2 further supplies a current to the wiring 32 when it receives the start signal. The current is applied to the reset signal generating circuit 40 to develop a bias voltage across a resistor 33. An NPN transistor 35 thereby turns on, and the collector potential of the transistor 35 falls. The waveform C shows the collector potential of the transistor 35. Since the transistor 35 is connected to the base of an NPN transistor 36, the collector potential of the transistor 35 falls from a base-emitter voltage $V_{BE(36)}$ of the transistor 36 to almost ground potential.

The transistor 36 turns off, and consequently a microcurrent source 39 supplies a current $I_D$ to a capacitor 37 to charge it. The waveform D shows a charge voltage of the capacitor 37. The charge of the capacitor 37 starts with the turning-off of the transistor 36, the turning-off of the transistor 36 starts with the turning-on of the transistor 35, the turning-on of the transistor 35 starts with the current supply from the injector current source 2, and the current supply from the injector current source 2 starts with a rise of the start signal. For this reason, ideally, a rise time of the waveform D coincides with the rise of the start signal.

The charge voltage of the capacitor 37 continues to rise until an NPN transistor 38 turns on to a base-emitter voltage $V_{BE(38)}$ of the transistor 38 for a period T. The reset signal activates by the turning-on of the transistor 38, whereby a potential of the reset signal input terminal 7 falls. The waveform E shows the potential of the reset signal input terminal 7, which falls when the charge voltage of the capacitor 37 attains the base-emitter voltage $V_{BE(38)}$. The logic circuit 3 is therefore reset after the period T from the start signal rise as shown in the waveform A. Assuming that a capacitance of the capacitor 37 is $C_{37}$, the period T is expressed as $T = C_{37} \cdot V_{BE(38)} / I_D$.

In the logic circuit 3, the reset signal input terminal 7 is generally connected only to elements to be reset and accordingly has small load, resulting in a relatively sharp fall of the waveform E. On the other hand, the source injector current $I_{inj}$ is applied to all of the gates of IIL elements constituting the logic circuit 3 and accordingly the injector current source 2 for supplying the source injector current $I_{inj}$ has large load, resulting in a relatively slow rise of the waveform B.

Moreover, there is time-lag due to resistance elements of the wiring 5 and floating capacitance of the IIL elements constituting the logic circuit 3. For this reason, some IIL elements constituting the logic circuit 3 may be supplied with an injector current requiring a period S longer than the period T to attain the predetermined current from the start signal rise as shown in the waveform F. In this case, there arises such a problem that the reset signal falls when the gates of some IIL elements in the logic circuit 3 do not yet receive the injector current, so that the logic circuit 3 can not perform a normal operation and can not give a stable output, and therefore, fails to be reset.

Since the period which all of the source injector currents $I_{inj}$ applied to the IIL elements constituting the logic circuit 3 require to attain the predetermined value considerably varies depending on the layout of the IIL elements and floating capacitance therein, it is difficult to determine the optimum period T. Therefore, the period T should be determined sufficiently long.

However, as can be seen in the above formula, in order to make the period T longer, it is necessary to increase the capacitance of the capacitor 37 $C_{37}$, and accordingly the circuit scale of the reset signal generating circuit 40 becomes larger. Enlargement of the circuit scale causes a new problem of substantial degradation in the integrated circuit integration, and moreover, makes it impossible to perform a high speed operation.

SUMMARY OF THE INVENTION

According to the first aspect of the present invention, a reset signal output circuit comprises: (a) an injector current source for supplying a source injector current; (b) a logic circuit formed on diffusion regions of a first conductivity type selectively formed on a main surface of a semiconductor substrate of a second conductivity type which is complementary to the first conductivity type, having a plurality of IIL elements each of which has an injector current input end to which the injector current source is connected to receive a part of the source injector current as an injector current; (c) a first transistor formed on one of the diffusion regions, having an emitter region connected to the injector current source; and (d) an output portion for outputting a reset signal in response to conduction of the first transistor. In the reset signal output circuit, the reset signal is applied to the logic circuit.

Preferably, in the reset signal output circuit, a wiring resistance for connection between the emitter region of the first transistor and the injector current source is larger than any of wiring resistances for connection between the injector current input ends of the IIL elements constituting the logic circuit and the injector current source.

In the reset signal output circuit in accordance with the first aspect of the present invention, the output portion outputs the reset signal at a timing that the current fed to the first transistor by the injector current source attains the predetermined value.

In this case, the timing becomes later as the wiring for connecting the first transistor and the injector current source becomes longer.

Thus, since the current flowing in the first transistor of the output portion attains the predetermined value later than the injector currents flowing in the IIL elements, the injector currents have already attained the predetermined value when the reset operation is performed. Therefore, it is possible to ensure a reset operation of the IIL elements in a stable and reliable way.

According to the second aspect of the present invention, in the reset signal output circuit, the output portion further has (d-1) a second transistor which has a conductivity type complementary to that of the first transistor having a base region connected to a collector region of the first transistor and a collector region for outputting the reset signal.

In the reset signal output circuit, particularly, in accordance with the second aspect of the present invention, the second transistor serves as the output portion and turns on at the timing.

Therefore, the second transistor generates the reset signal at the timing that the current flowing in the first transistor attains the predetermined value.

According to the third aspect of the present invention, in the reset signal output circuit, the transistor and the output portion are formed on each of a plurality of monitoring elements. The output portions of the plurality of monitoring elements each output a base reset signal, not reset signal. The reset signal output circuit further comprises an output circuit which receives all of the base reset signals and then outputs the reset signal.

In the reset signal output circuit in accordance with the third aspect of the present invention, the output portion outputs the base reset signal at a timing that the current fed to the transistor by the injector current source attains the predetermined value. Then, the output circuit outputs the reset signal at a timing that the latest base reset signal is outputted.

Thus, the IIL element are reset at the timing of the latest base reset signal among all of the base reset signals outputted from the plurality of monitoring elements, thereby ensuring a reset operation in a stable and reliable way.

According to the fourth aspect of the present invention, a semiconductor integrated circuit device comprises: (a) an injector current source for supplying a source injector current; (b) a logic circuit comprising a plurality of IIL elements consisting of a first diffusion region of a first conductivity type selectively formed on a main surface of a semiconductor substrate of a second conductivity type which is complementary to the first conductivity type and connected to the injector current source and a plurality of second diffusion regions of the first conductivity type which are selectively formed on the main surface of the semiconductor substrate separately from the first diffusion region and each of which is disposed in parallel with one another; (c) a monitoring element including: (c-1) a first transistor having an emitter region which is a portion of the first diffusion region, a collector region of the first conductivity type disposed on the main surface of the semiconductor substrate separately from the emitter region and in parallel with the second diffusion regions and a base region which is defined between the emitter region and the collector region on the semiconductor substrate; and (c-2) a second transistor having a collector region of the second conductivity type formed on a main surface of the collector region of the first transistor, a base region which is the collector region of the first transistor and an emitter region which is a portion of the semiconductor substrate. In the semiconductor integrated circuit device, the logic circuit is reset by a reset signal and the monitoring element outputs the reset signal from the collector region of the second transistor.

In the semiconductor integrated circuit in accordance with the fourth aspect of the present invention, the first and second transistors using the first and second diffusion regions constituting the IIL element detects whether the current from the injector current source attains the predetermined value or not.

Thus, the first and second transistors are formed on the diffusion regions constituting the IIL elements, thereby ensuring a stable and reliable reset operation of the IIL elements without degradation in the integrated circuit integration.

According to the fifth aspect of the present invention, a semiconductor integrated circuit device comprises: (a) an injector current source for supplying a source injector current; (b) a plurality of monitoring elements, each comprising: (b-1) a first transistor having an emitter region formed on a main surface of a semiconductor substrate of a first conductivity type and connected to the injector current source, a collector region of a second conductivity type which is complementary to the first conductivity type formed on the main surface of the semiconductor substrate separately from the emitter region and a base region which is defined between the emitter region and the collector region on the semiconductor substrate; and (b-2) a second transistor having a collector region of the first conductivity type formed on the collector region of the first transistor, a base region which is the collector region of the first transistor and an emitter region which is a portion of the semiconductor substrate; and (c) a plurality of IIL elements consisting of a first diffusion region of the second conductivity type selectively formed on the main surface of the semiconductor substrate and connected to the injector current source and a plurality of second diffusion regions of the second conductivity type which are selectively formed on the main surface of the semiconductor substrate separately from the first diffusion region and each of which is disposed in parallel with one another. In the semiconductor integrated circuit device, (b-3) the plurality of monitoring elements each output a base reset signal from the collector region of the second transistor, (c-1) a part of the plurality of IIL elements constitute an output circuit for receiving all of the base reset signals from the plurality of monitoring elements and then outputting a reset signal and (c-2) the rest of the plurality of IIL elements constitute a logic circuit for being reset by the reset signal from the output circuit.

In the semiconductor integrated circuit device in accordance with the fifth aspect of the present invention, the IIL elements constitute the logic circuit and the output circuit for outputting the reset signal after receiving all of the base reset signals.

Thus, since the output circuit consists of the IIL elements, it is possible to ensure a stable and reliable reset operation of the IIL elements without degradation in the integrated circuit integration.

An object of the present invention is to provide an IIL integrated circuit device which detects that all the gates of the IIL elements constituting a logic circuit receive injector currents and then performs a reset, thereby determining an optimum waiting period from a starting to a reset to ensure a reliable reset operation, and moreover reduces its circuit scale to thereby require only a small area therefor on the integrated circuit.

These and other objects, features, aspects and advantages of the present invention will become more apparent from the following detailed description of the present invention when taken in conjunction with the accompanying drawings.

DESCRIPTION OF THE PREFERRED EMBODIMENTS

The First Preferred Embodiment

Figure 1:
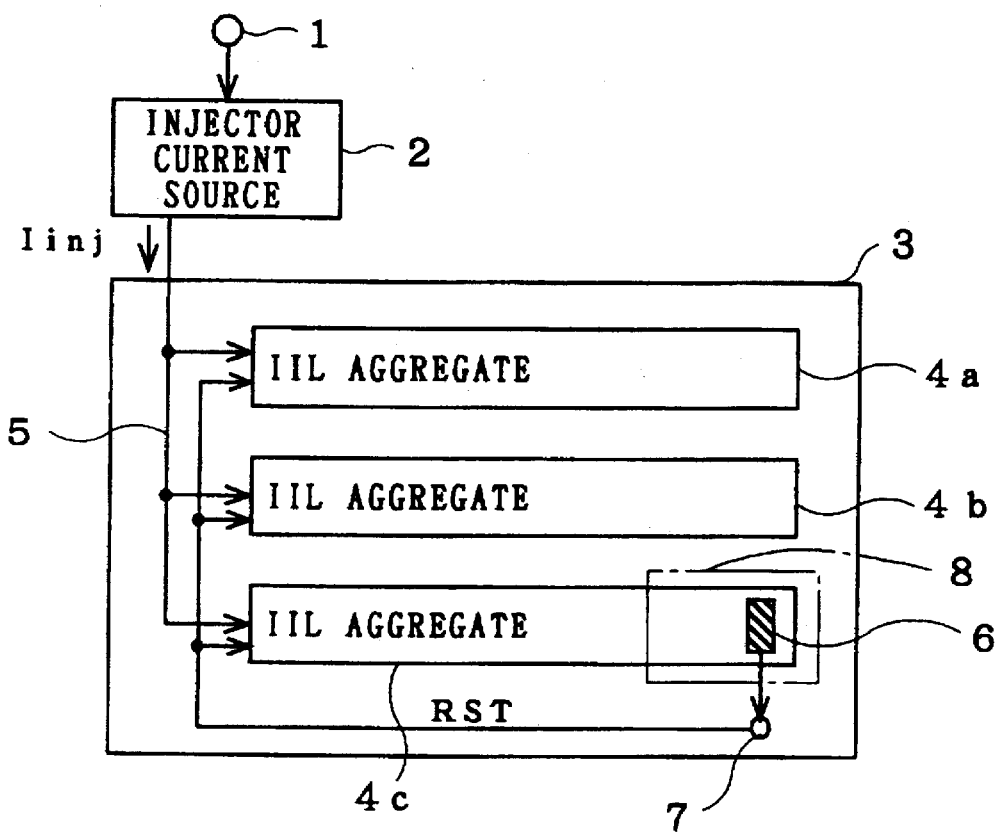
FIG. 1 is a plan view showing a first preferred embodiment in accordance with the present invention.

FIG. 1 is a plan view illustrating an IIL integrated circuit device in accordance with a first preferred embodiment of the present invention. A logic circuit 3 comprises IIL aggregates 4a, 4b and 4c each consisting of a plurality of IIL elements, and a reset terminal 7 for applying a reset signal RST. The IIL aggregates 4a, 4b and 4c are connected through a wiring 5 to an injector current source 2. The logic circuit 3 and the injector current source 2 are provided on the same IC.

The injector current source 2 is connected to a start signal input terminal 1 for receiving a start signal, and supplies a source injector current $I_{inj}$ to the wiring 5 in response to a change of the start signal. The source injector current $I_{inj}$ is distributed to each of the IIL aggregates 4a, 4b and 4c.

In designing the logic circuit 3 utilizing IIL elements, generally, which of the IIL elements that needs the longest time until the applied injector current attains a predetermined value is obtained (hereinafter, the time that the applied injector current requires to attain a predetermined value is simply referred to as "delay time"). For example, in a case that the delay time mainly depends on the resistance element of the wiring 5, the IIL element having the longest distance from the wiring 5 in the IIL aggregate that needs the longest wiring 5 from the injector current source 2 (IIL aggregate 4c in FIG. 1) has the longest delay time. In a case that it mainly depends on the capacitance element of the wiring 5, the IIL element that has the longest delay time can be found in a designing stage by performing a simulation with the capacitance element taken into consideration.

Thus, in the designing stage, a monitoring element 6 is designed to utilize the IIL element that is expected to need the longest delay time. In FIG. 1, the monitoring element 6 is located at the longest distance from the output end of the injector current source 2, specifically, at a counter position to the output end of the injector current source 2 (the right end of the lowermost IIL aggregate 4c in FIG. 1), where the IIL element has the longest delay time.

Figure 2:
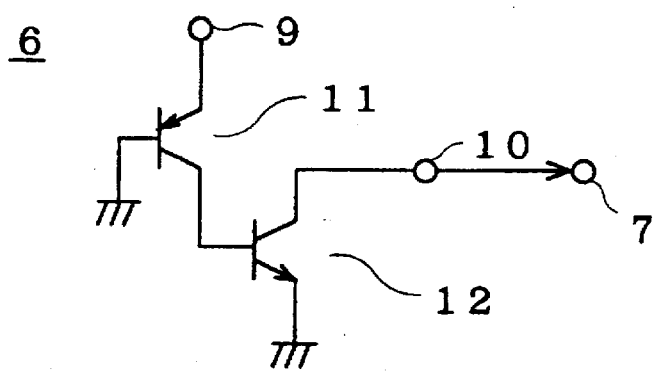
FIG. 2 is a circuit diagram showing the first preferred embodiment in accordance with the present invention.

FIG. 2 is a circuit diagram showing a configuration of the monitoring element 6. The monitoring element 6 consists of an injector PNP transistor 11 and a reverse NPN transistor 12 like regular IIL elements.

The emitter of the transistor 11 is connected to an injector current input end 9, and the collector of the transistor 12 is connected to an output terminal 10 of the IIL element. The collector of the transistor 11 is connected only to the base of the transistor 12, and accordingly does not receive a logic signal unlike regular IIL elements. The base of the transistor 11 and the emitter of the transistor 12 are grounded in common.

An injector current is supplied through the wiring 5 to the injector current input end 9 of the monitoring element 6. When the injector current attains the predetermined value, a potential of the output terminal 10 falls. By connecting the output terminal 10 to the reset signal input terminal 7 of the logic circuit 3, the logic circuit 3 is reset after the injector current attains the predetermined value at the injector current input end 9 of the monitoring element 6.

As described earlier, the injector current in the monitoring element 6 attains the predetermined value latest. Accordingly, when the logic circuit 3 is reset, the injector currents in all of the other IIL elements have already attained the predetermined value, so that it is possible to prevent an unstable operation as caused in the conventional art, and to ensure a reliable reset operation of the logic circuit 3.

Specifically, a reset operation of the logic circuit 3 is carried out by delivering a reset signal RST to each of the IIL aggregates 4a, 4b and 4c. A potential of the reset signal input terminal 7 can be employed as the reset signal RST.

Figure 3:
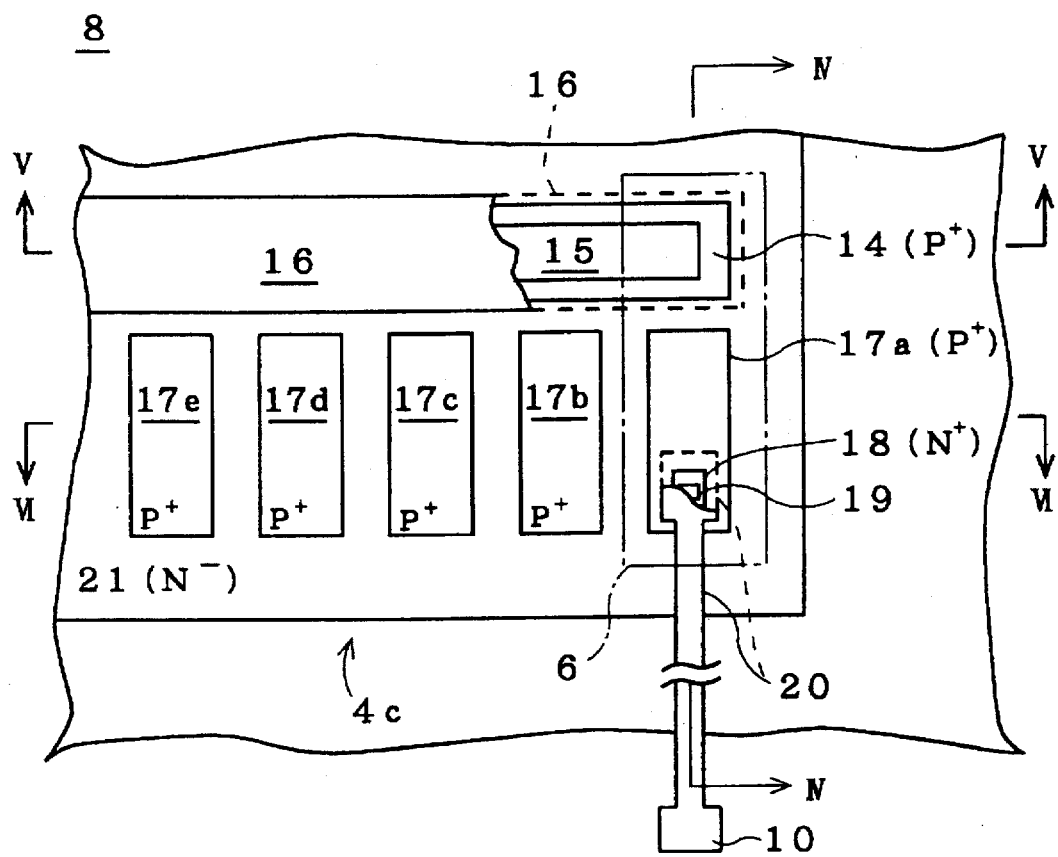
FIG. 3 is a plan view showing the first preferred embodiment in accordance with the present invention.
Figure 4:
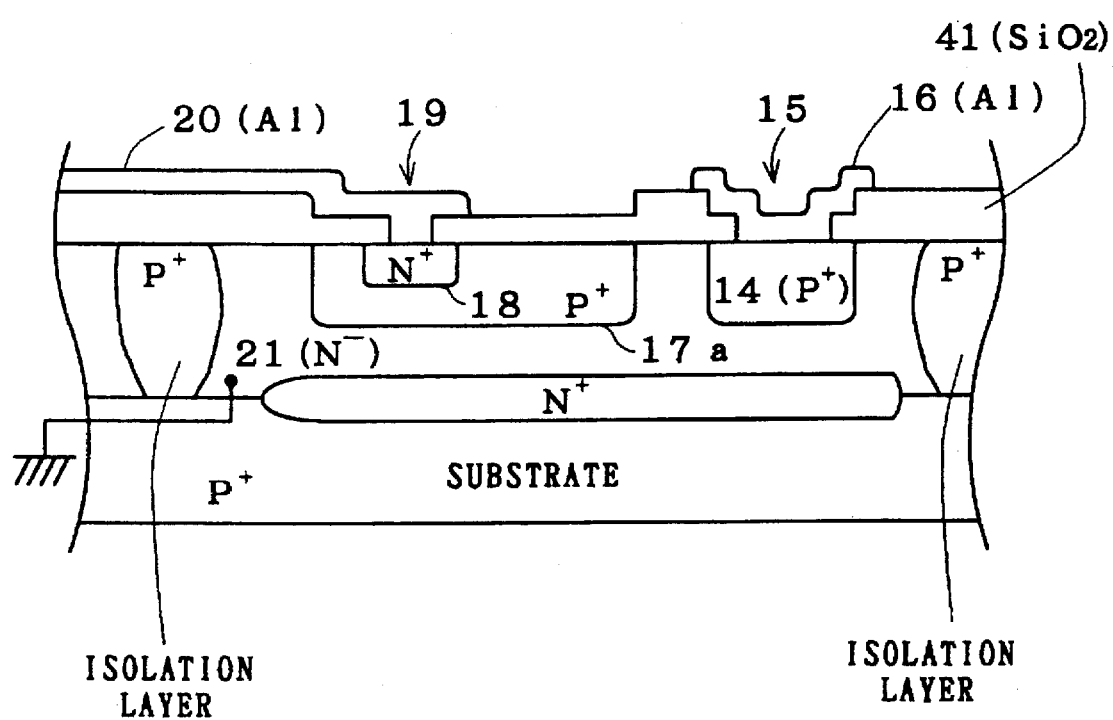
FIGS. 4, 5 and 6 are sectional views showing the first preferred embodiment in accordance with the present invention.
Figure 5:
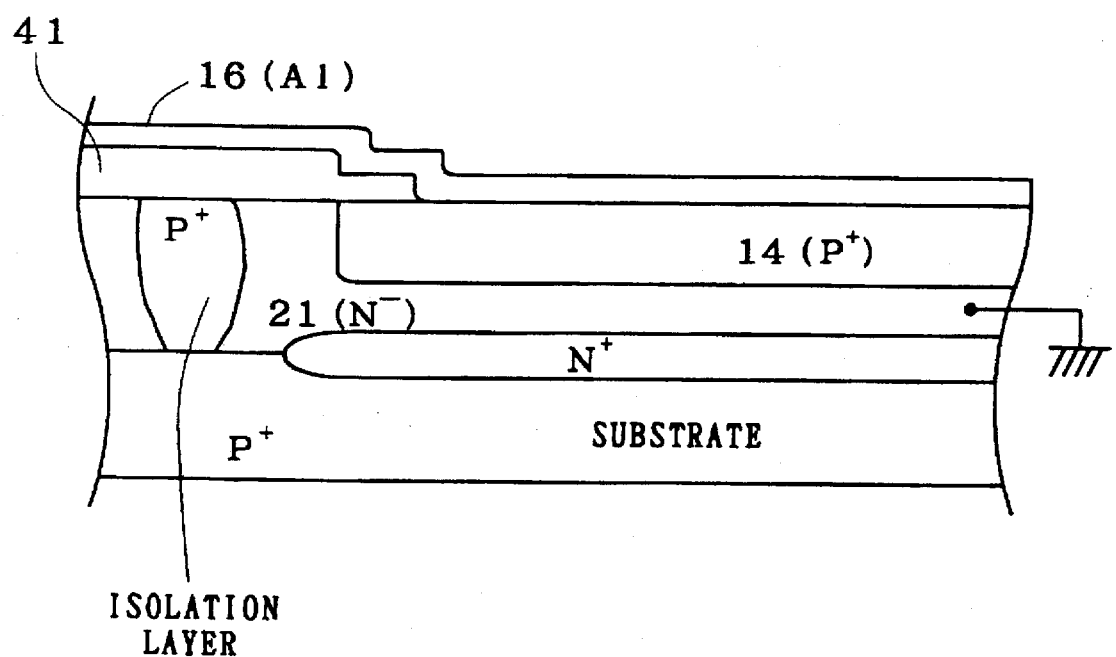
Figure 6:
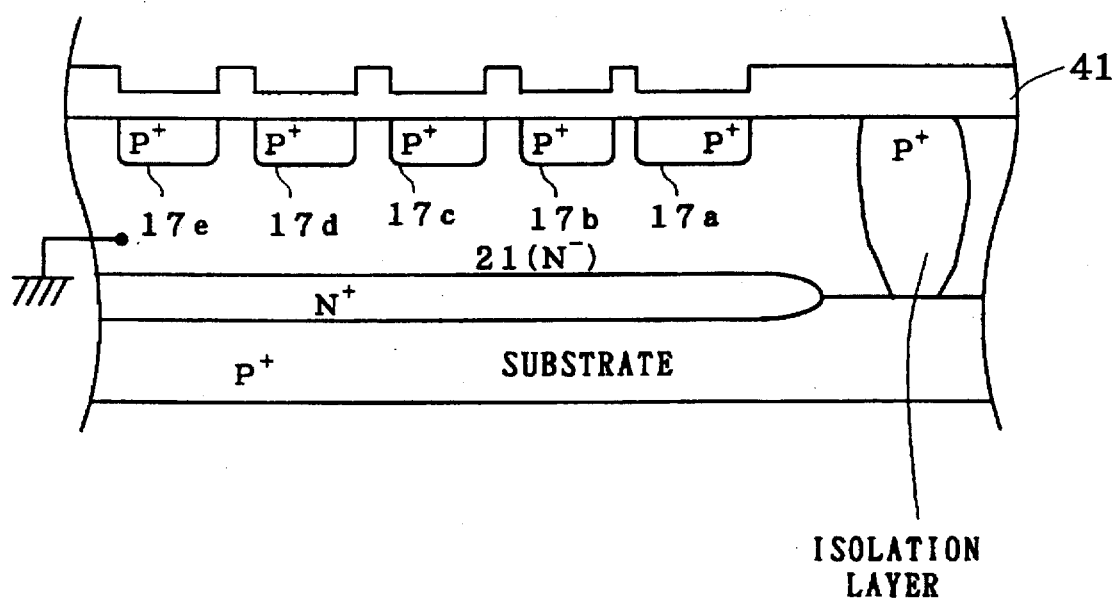

It is easy to construct the monitoring element 6 by utilizing an IIL element. FIG. 3 is an enlarged plan view of a region 8 in FIG. 1. FIGS. 4, 5 and 6 are enlarged sectional views taken in the sections IV—IV, V—V and VI—VI, respectively. In FIG. 3, for the purpose of simplification, a surface insulating layer 41 made of $SiO_2$ is disregarded and some electrode structures are removed.

P⁺ diffusion regions 14, 17a to 17e are selectively formed on a main surface of an epitaxial N⁻ layer 21. The P⁺ diffusion regions 17a to 17e are disposed in alignment. The P⁺ diffusion regions 17b to 17e *constitute the IIL element and the P⁺* diffusion region 17a disposed on the right end of the IIL aggregate 4c is a constituent of the monitoring element 6. Specifically, the P⁺ diffusion region 17a corresponds to the collector region of the transistor 11 and the base region of the transistor 12.

P⁺ diffusion region 14, which extends in the same direction as the P⁺ diffusion regions 17a to 17e are aligned, is used as the emitter region of the transistor 11 and also used as a common injector transistor region for the IIL elements in the same IIL aggregates 4c.

An N⁻ diffusion region 18 is selectively formed on a main surface of the P⁺ diffusion region 17, and is used as the collector region of the transistor 12.

A wiring 16 mainly containing Al is formed over the P⁺ diffusion region 14, and is connected thereto through a contact region (via hole) 15, which acts as the wiring 5. A wiring 20 mainly containing Al is formed over the N⁻ diffusion region 18, and is connected thereto through a contact region (via hole) 19 and is connected, on the other hand, to the output terminal 10. The output terminal 10 may also act as the reset signal input terminal 7. In FIG. 3, the wirings 16 and 20 are partially removed for the purpose of clearly showing the contact regions 15 and 19.

Figure 7:
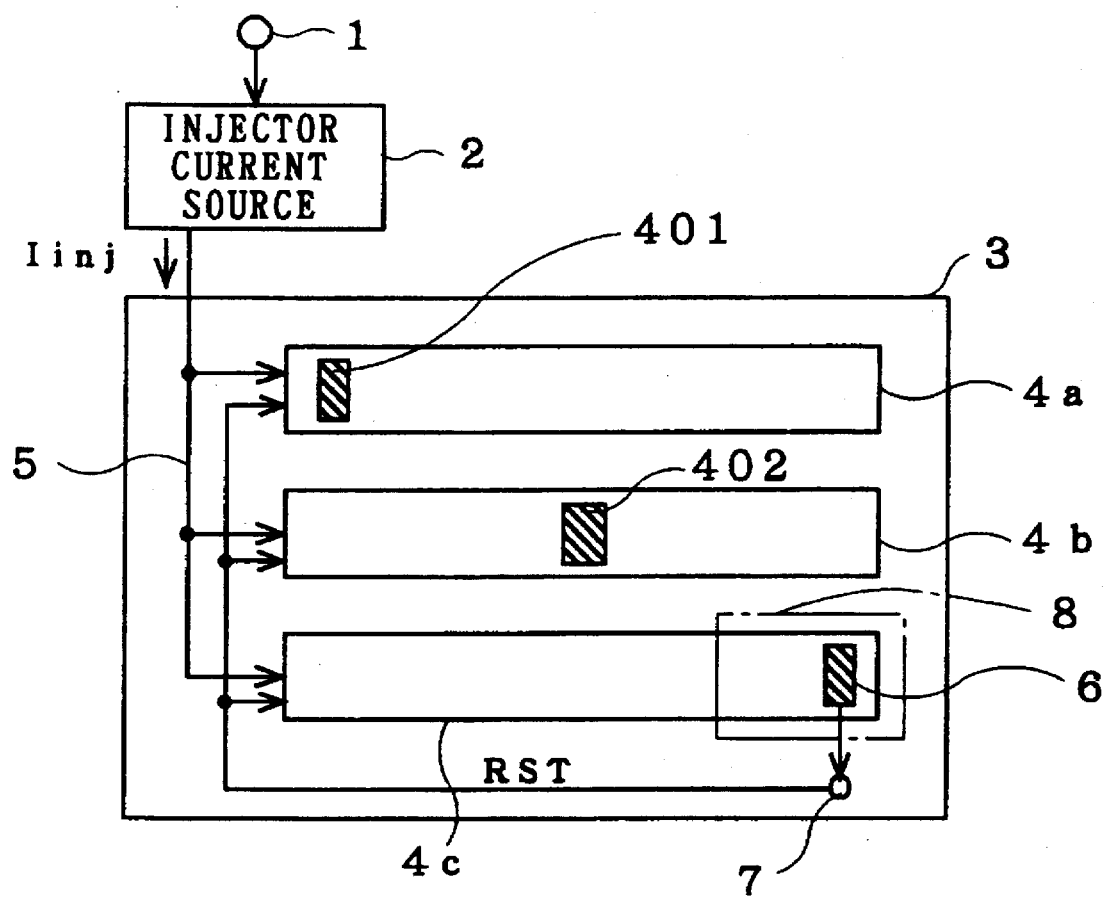
FIG. 7 is a plan view illustrating an effect of the first preferred embodiment in accordance with the present invention.
Figure 8:
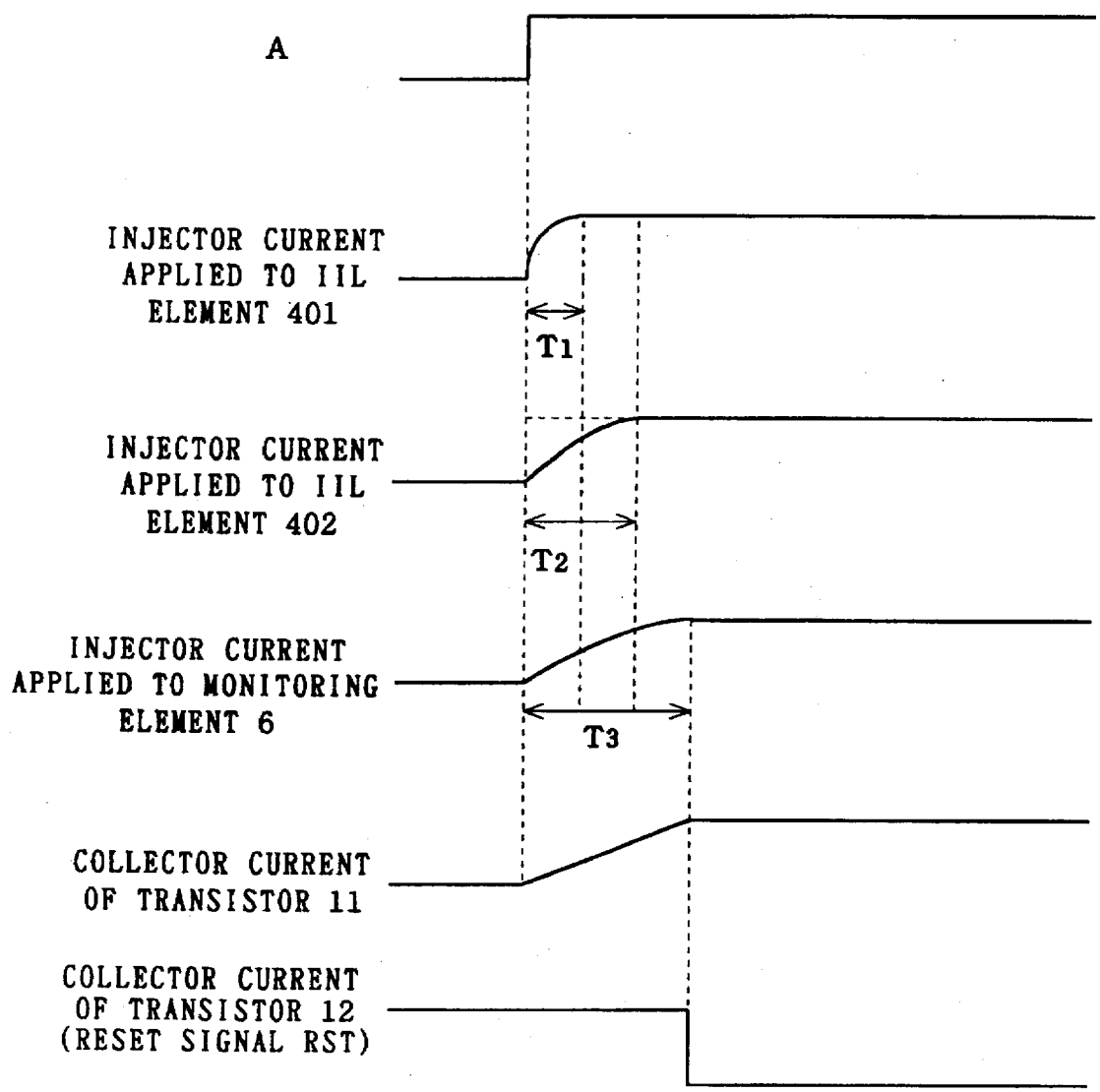
FIG. 8 shows waveform charts illustrating the effect of the first preferred embodiment in accordance with the present invention.

FIGS. 7 and 8 illustrate an effect of the first preferred embodiment. FIG. 7 shows some IIL elements on various positions in the logic circuit 3, and FIG. 8 shows respective signal waveforms in the elements of FIG. 7 and, for reference, also shows a waveform A of the start signal.

An IIL element 401 is located on the left end of the IIL aggregate 4a and an IIL element 402 is located substantially in the center of the IIL aggregate 4b. For this reason, the time $T_2$ required until the injector current of the IIL element 402 attains the predetermined value is longer than the time $T_1$ required until the injector current of the IIL element 401 attains the predetermined value. Furthermore, the time $T_3$ required until the injector current of the monitoring element 6 attains the predetermined value is longer than the time $T_2$.

Thus, the time $T_3$ is longer than any other times required until the injector currents of the other IIL elements attains the predetermined value. Accordingly, in FIG. 2, a timing that the collector current of the transistor 11 attains the predetermined value and the collector voltage of the transistor 12 falls takes place after the injector currents applied to all of the IIL elements attain the predetermined value. Since the collector voltage of the transistor 12 serves as the reset signal RST, reset operations of all the IIL elements are therefore performed after the injector currents of all the IIL elements attain the predetermined value.

Thus, according to the first preferred embodiment, the monitoring element 6 is formed by utilizing the IIL element that is expected to need the longest delay time, and supplies the reset signal. Therefore, the waiting time from the starting to the reset of the logic circuit 3 can be determined to be longer than any other delay times of the IIL element, and not to be too long in vain. Moreover, only a small area is required for reset operation, resulting in substantially no degradation in the integrated circuit integration.

The Second Preferred Embodiment

As described in the first preferred embodiment, the monitoring element 6 is formed by utilizing the IIL element that is expected to need the longest delay time in the designing stage. However, there may be a case, in fabricating the logic circuit 3 which is provided with the monitoring element 6, where an IIL element needs a delay time that is a little longer than that of the IIL element for the monitoring element 6. There may be another case, in designing, where it is difficult to choose only one IIL element that needs the longest delay time.

Figure 9:
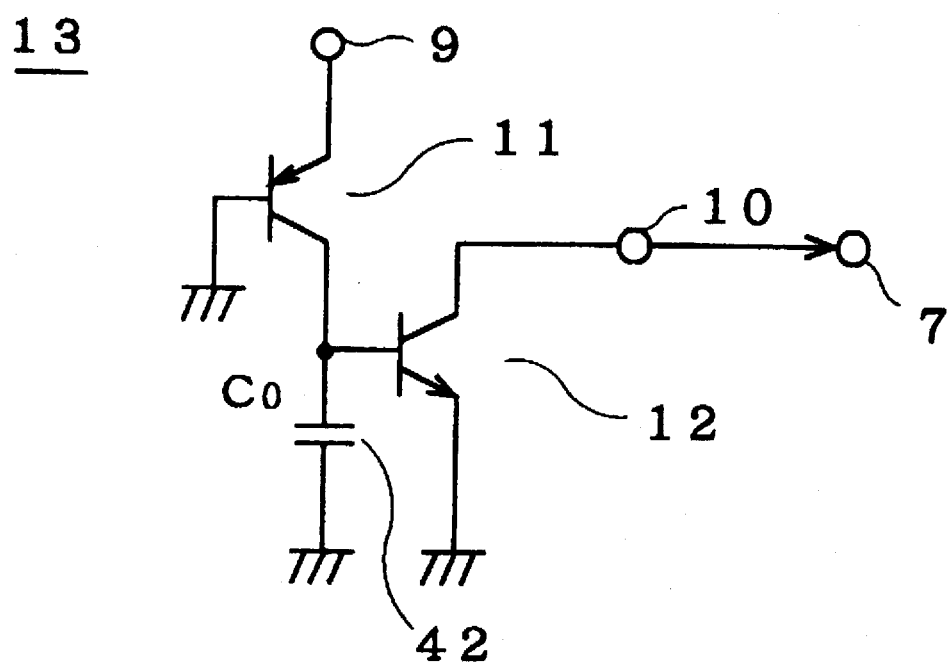
FIG. 9 is a circuit diagram showing a second preferred embodiment in accordance with the present invention.

The second preferred embodiment ensures an enough waiting time for reset operation even in these cases, and requires only a small area like in the first preferred embodiment. FIG. 9 is a circuit diagram showing a configuration of a monitoring element 13 used in the second preferred embodiment of the present invention, which corresponds to the monitoring element 6 of FIG. 2 in the first preferred embodiment. In the monitoring element 13, the collector of the transistor 11 and the base of the transistor 12 do not receive a logic signal like in the monitoring element 6, but are grounded through a capacitor 42 unlike in the monitoring element 6.

In the monitoring element 13 having the foregoing configuration, a potential of the output terminal 10 does not fall immediately after the injector current applied to the injector current input end 9 attains the value $I_o$ that is required for starting the IIL element. Assuming that the capacitance of the capacitor 42 is $C_o$ and the base-emitter voltage of the transistor 12 at turning-on is $V_{BE(12)}$, a fall of the potential of the output terminal 10 is delayed for $T_d = C_o \cdot V_{BE(12)}/I_o$.

Thus, additional provision of the capacitor 42 to the monitoring element 6 makes it possible to obtain an IIL monitoring element apparently having the longest delay time. By connecting the output terminal 10 of the monitoring element 13 to the reset signal input terminal 7, it becomes possible to ensure a reset operation of the IIL element having a little longer delay time than the delay time of the monitoring element 13 without the capacitor 42. In another case that more than one IIL element is expected to need the longest delay time, the monitoring element 13 is formed by utilizing one of them, thereby achieving the same effect as the first preferred embodiment.

Figure 10:
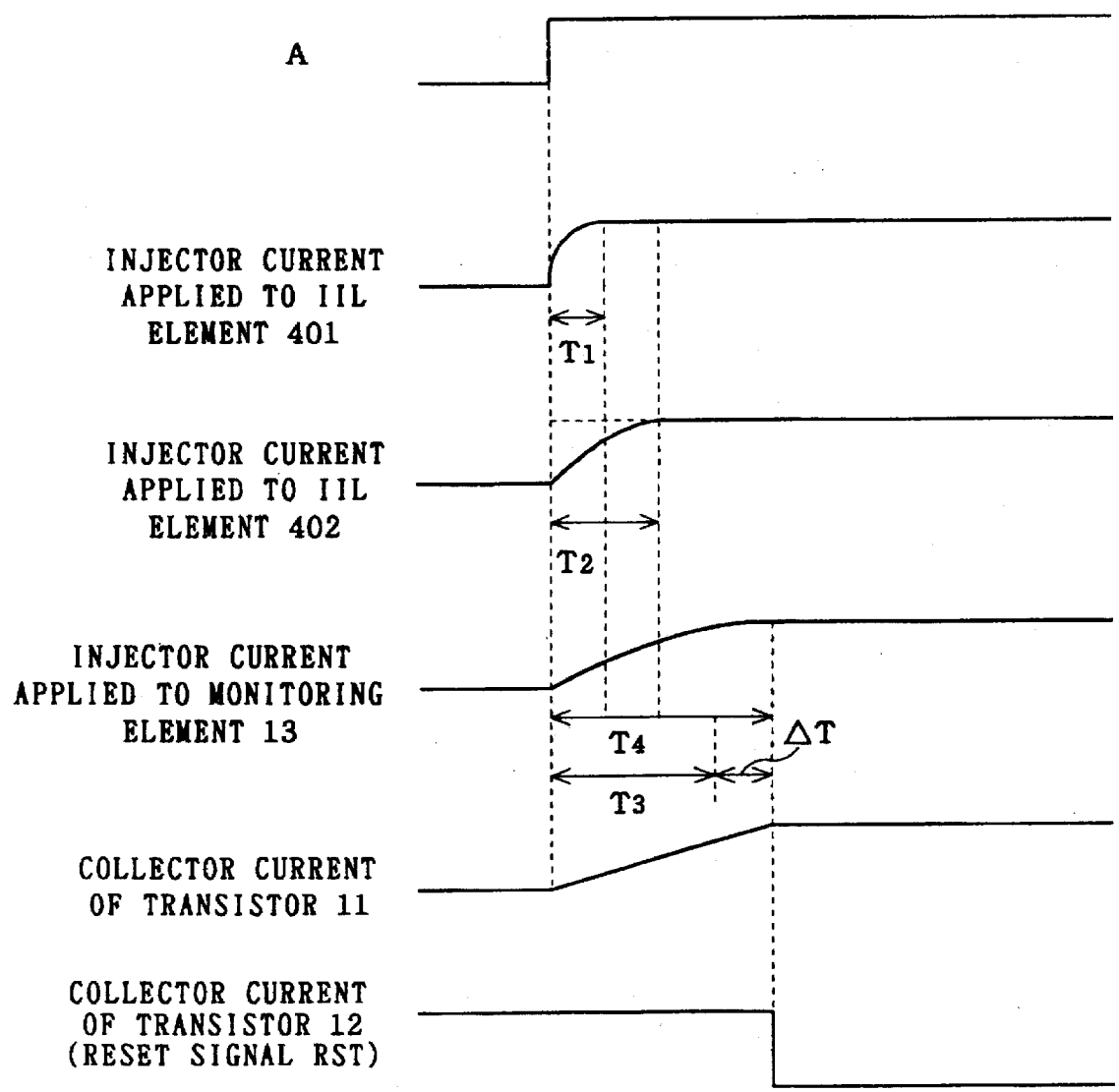
FIG. 10 shows waveform charts illustrating an effect of the second preferred embodiment in accordance with the present invention.

FIG. 10 shows waveform charts illustrating the effect of the second preferred embodiment, corresponding to FIG. 8, in which the monitoring element 13 is used instead of the monitoring element 6 of FIG. 7.

In FIG. 10, the time $T_4$ required until the injector current of the monitoring element 13 attains the predetermined value is longer than $T_3$ by $\Delta T$, as compared with the injector current of the monitoring element 6 of FIG. 8. This results from the additional provision of the capacitor 42.

Accordingly, the time required until the collector current of the transistor 11 of FIG. 9 attains the predetermined value is longer than that of the transistor 11 of FIG. 2. Therefore, the reset signal RST falls later. Moreover, since only the capacitor 42 is additionally provided instead of such a complex reset signal generating circuit 40 as used in the conventional art, the integrated circuit integration is slightly deteriorated as compared with the first preferred embodiment, but considerably improved as compared with the conventional art.

Figure 11:
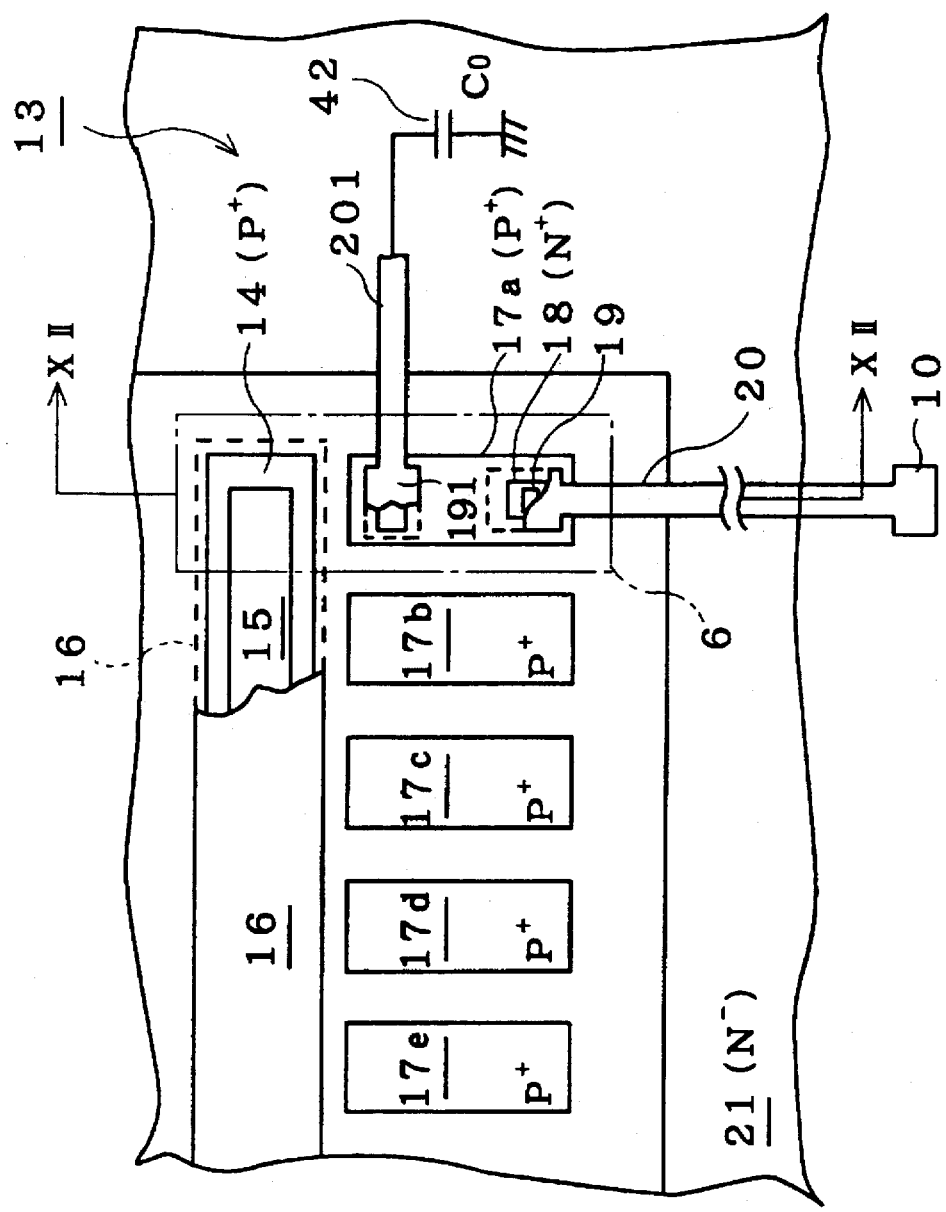
FIG. 11 is a plan view showing the second preferred embodiment in accordance with the present invention.
Figure 12:
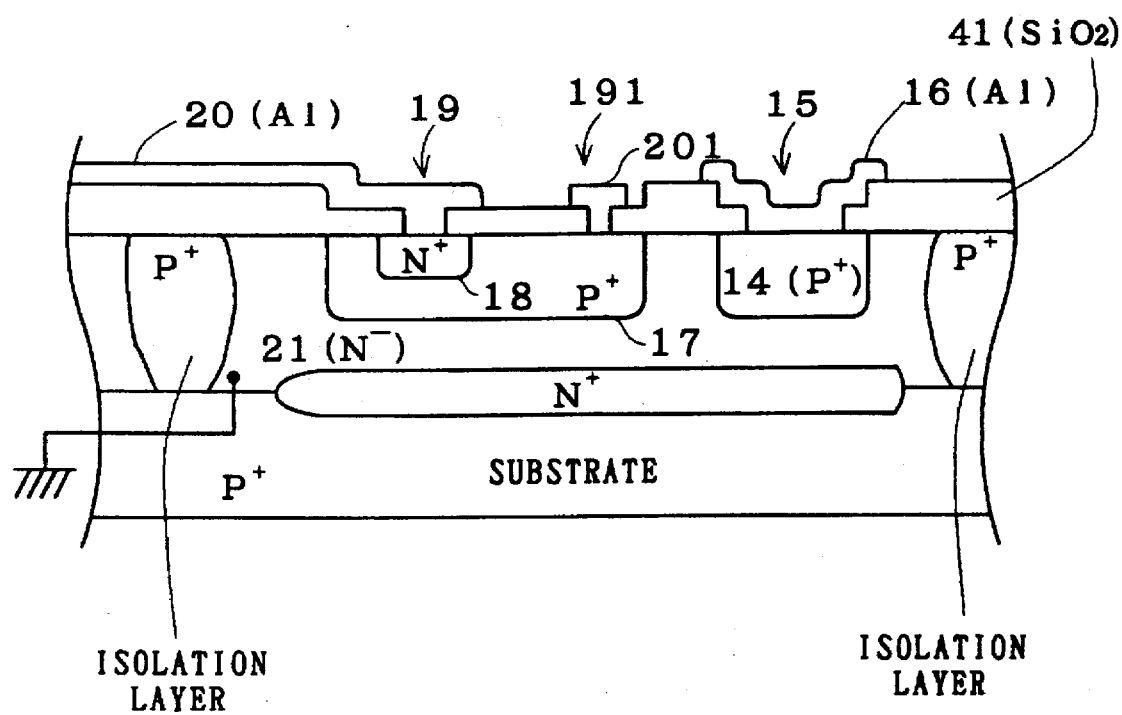
FIG. 12 is a sectional view showing the second preferred embodiment in accordance with the present invention.

FIG. 11 is a plan view illustrating an IIL integrated circuit device in accordance with the second preferred embodiment of the present invention, corresponding to FIG. 3 of the first preferred embodiment. FIG. 12 is an enlarged sectional view taken in the section X II—X II of FIG. 11, corresponding to FIG. 4. A wiring 201 is formed to be connected through a contact region 191 to the P⁺ diffusion region 17a. In FIG. 11, the wiring 201 is partially removed for the purpose of clearly showing the contact region 191. It is easy to form the monitoring element 13 by connecting the capacitor 42 which is provided on the same IC as the injector current source 2 to the wiring 201.

The Third Preferred Embodiment

In a case that it is difficult to choose only one IIL element which is expected to need the longest delay time even in the designing stage, a logic element which is additionally provided makes it possible to perform a reset operation in accordance with the IIL element having the longest delay time.

Figure 13:
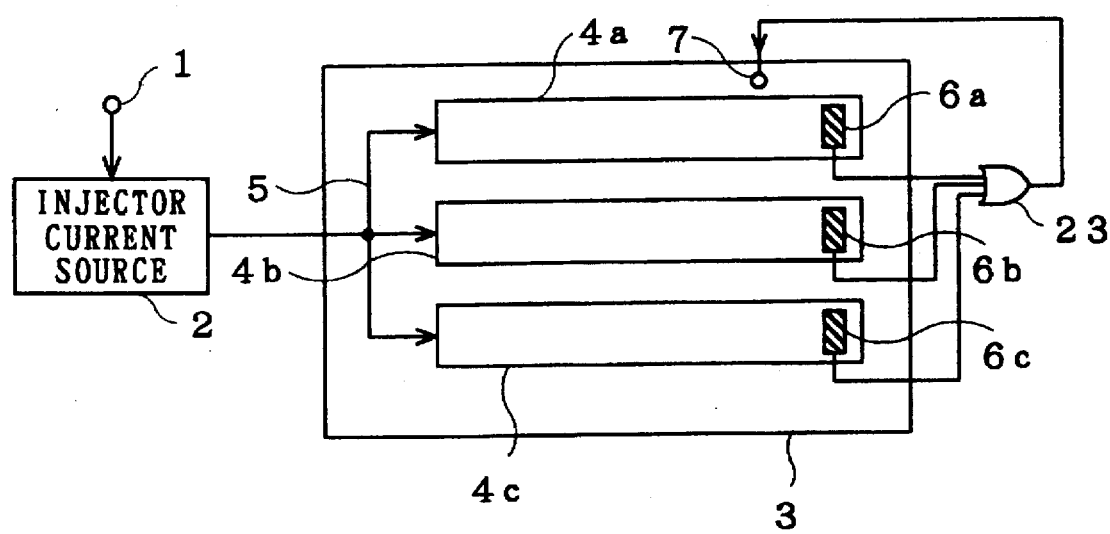
FIG. 13 is a plan view showing a third preferred embodiment in accordance with the present invention.

FIG. 13 is a plan view illustrating an IIL integrated circuit device in accordance with the third preferred embodiment of the present invention. FIG. 13 is different from FIG. 1 in that all of the wirings 5 laid from the injector current source 2 to the IIL aggregates 4a, 4b and 4c have equal length. The injector current source 2 and the logic circuit 3 are provided on the same IC like in the first and second preferred embodiments.

In this case, since all of the wirings 5 laid to the IIL aggregates 4a, 4b and 4c have the same wiring resistance and wiring capacity, it may be difficult to choose only one IIL element to be used for forming the monitoring element from any of the IIL aggregates.

Under this condition, monitoring elements 6a, 6b and 6c are constructed in the IIL aggregates 4a, 4b and 4c, respectively, by each utilizing the IIL element having the longest delay time in the IIL aggregate. Each of the monitoring elements 6a, 6b and 6c has the same configuration as the monitoring element 6 of FIG. 2.

In the above configuration, one of the monitoring elements 6a, 6b and 6c has the longest delay time. An OR gate 23 is further provided, and the input terminal thereof is connected to each of the output terminals 10 of the monitoring elements 6a, 6b and 6c. An output of the OR gate 23 becomes "L" to apply a reset signal to the reset signal input terminal 7 only when all of the injector currents in the monitoring elements 6a, 6b and 6c attain the predetermined value. That is, a reset operation is performed in accordance with the longest delay time in all of the IIL elements. Hence, the third preferred embodiment achieves the same effect as the first preferred embodiment.

The Fourth Preferred Embodiment

The OR gate 23 is provided outside the IIL aggregates 4a, 4b and 4c (on the same IC) in the third preferred embodiment. However, it can be also provided inside the IIL aggregates, so that further improvement in the integrated circuit integration can be achieved because it is not necessary to secure an area for the OR gate 23.

Figure 14:
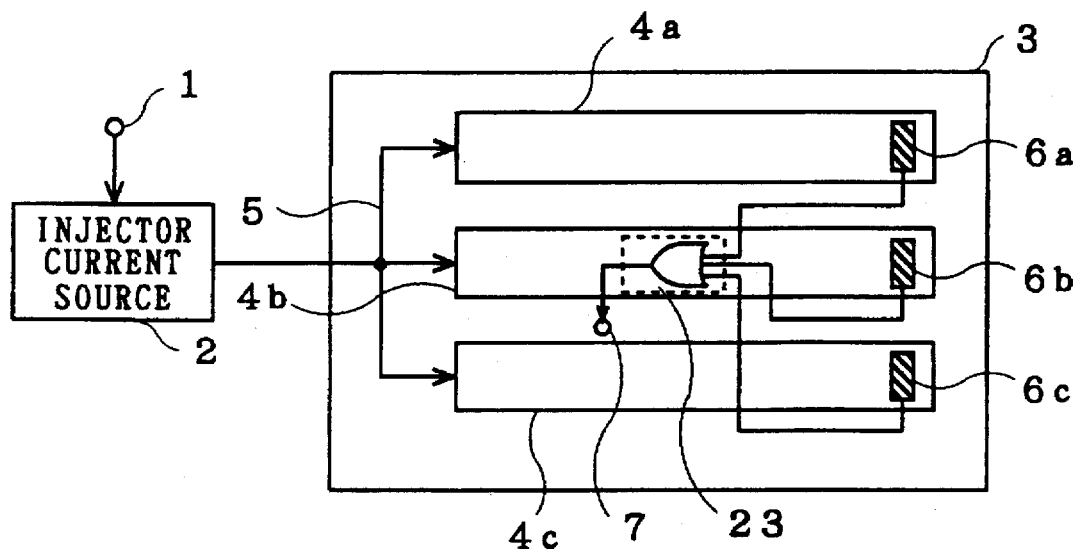
FIG. 14 is a plan view showing a fourth preferred embodiment in accordance with the present invention.

FIG. 14 is a plan view illustrating an IIL integrated circuit device in accordance with the fourth preferred embodiment of the present invention. FIG. 14 is different from FIG. 13 only in that the OR gate 23 is provided within the IIL aggregate 4b. The injector current source 2 and the logic circuit 3 are provided on the same IC.

Figure 15:
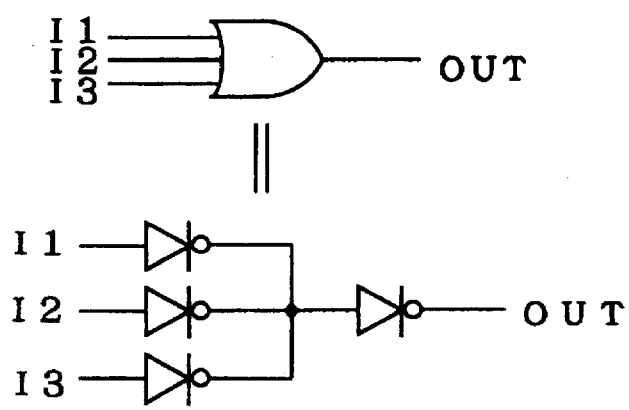
FIG. 15 is a circuit diagram showing the fourth preferred embodiment in accordance with the present invention.
Figure 16:
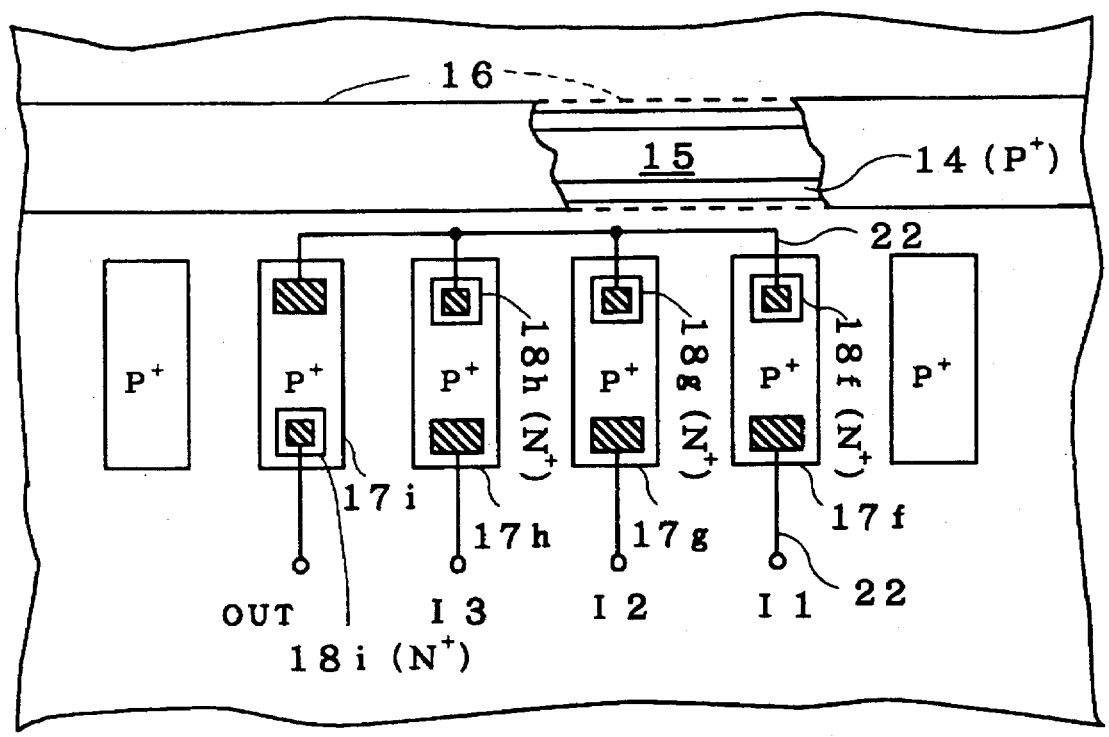
FIG. 16 is a plan view showing the fourth preferred embodiment in accordance with the present invention.

FIG. 15 is a circuit diagram showing an example of OR gate 23 consisting of IIL elements. FIG. 16 is a schematic plan view of a layout of OR gate 23 consisting of IIL elements. In this figure, for the purpose of simplification, contact regions are represented by crosshatching, and wiring regions are represented by solid line.

The OR gate 23 having three input terminals $I_1$, $I_2$ and $I_3$ and an output terminal OUT for producing logical sum of the three inputs comprises three $P^+$ diffusion regions 17f, 17g and 17h which are connected to the three input terminals $I_1$, $I_2$ and $I_3$ respectively and an $N^-$ diffusion region 18i connected to the output terminal OUT. The $N^-$ diffusion region 18i is selectively formed on a main surface of a $P^+$ diffusion region 17i. $N^-$ diffusion regions 18f, 18g and 18h are selectively formed on the main surfaces of $P^+$ diffusion regions 17f, 17g and 17h respectively and connected in common to the $P^+$ diffusion region 17i. These connections are made by a wiring 22. When the wiring 16 (partially removed in the figure) which is connected to the $P^+$ diffusion region 14 receives the inject current, these diffusion regions, as a whole, serve as the OR gate 23.

The IIL elements constituting the OR gate 23 each have shorter delay time as compared with the monitoring elements 6a, 6b and 6c. For this reason, when the potentials of the output terminals 10 of the monitoring elements 6a, 6b and 6c fall, the injector current has been already fed to the IIL elements. Further, all of the monitoring elements 6a, 6b and 6c need no requirement of reset operation, so that the OR gate 23 performs a normal operation. Therefore, the fourth preferred embodiment ensures an appropriate reset operation like the third preferred embodiment.

The Fifth Preferred Embodiment

It is also possible to achieve the same effect as the first preferred embodiment by employing an injector transistor instead of a reverse NPN transistor, both of which are constituents of IIL element and a bipolar transistor provided separately.

Figure 17:
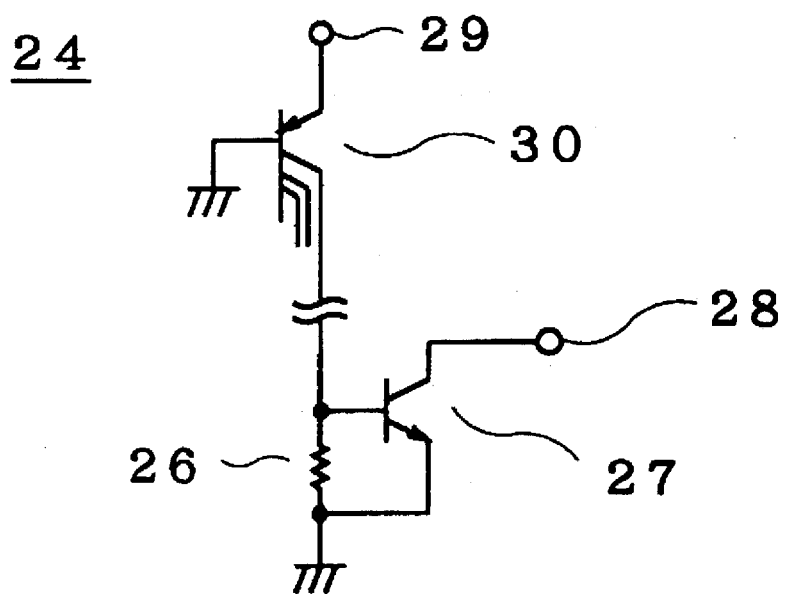
FIG. 17 is a circuit diagram showing a fifth preferred embodiment in accordance with the present invention.

FIG. 17 is a circuit diagram showing a configuration of a monitoring circuit 24 in accordance with the fifth preferred embodiment of the present invention. An injector transistor 30 constituting IIL element is a multicollector-type PNP transistor having a plurality of collectors. The emitter of the injector transistor 30 is connected to an injector current input end 29. Among the plurality of collectors, a collector in which the injector current attains the predetermined value latest is connected to the base of an NPN transistor 27 provided separately from the IIL element. A resistor 26 and the transistor 27 are provided on the same IC as the logic circuit 3.

The emitter of the transistor 27 is grounded, and the resistor 26 are connected between the base and emitter thereof. The collector of the transistor 27 is connected to an output terminal 28, to which the reset signal input terminal 7 is connected. When a current flows in the collector in which the injector current attains the predetermined value latest, a potential of the output terminal 28 falls through the resistor 26 and the transistor 27, and the reset signal input terminal 7 receives a reset signal of "L". Thus, the same effect as the first preferred embodiment is achieved.

The resistor 26 serves to cut a leak current. For example, in a case that a microcurrent is applied to the injector current input end 29 due to leak although the injector current source is in off-state, it prevents the transistor 27 from turning on.

Furthermore, the reason why a resistor for cutting the leak current is not provided in the first and second preferred embodiments is as follows: The transistor 12 is a reverse transistor formed in an IIL aggregate and has a low common-emitter static forward current transfer ratio $h_{FE}$. Therefore, even if the leak current flows therein, a current flowing in the output terminal 10 does not considerably increase (up to several times of the leak current), thus causing no problem. On the other hand, the transistor 27 is a bipolar transistor provided outside the IIL aggregate and accordingly has a high common-emitter static forward current transfer ratio $h_{FE}$. Therefore, there is a possibility that micro leak current may make the transistor 27 turn on.

Figure 18:
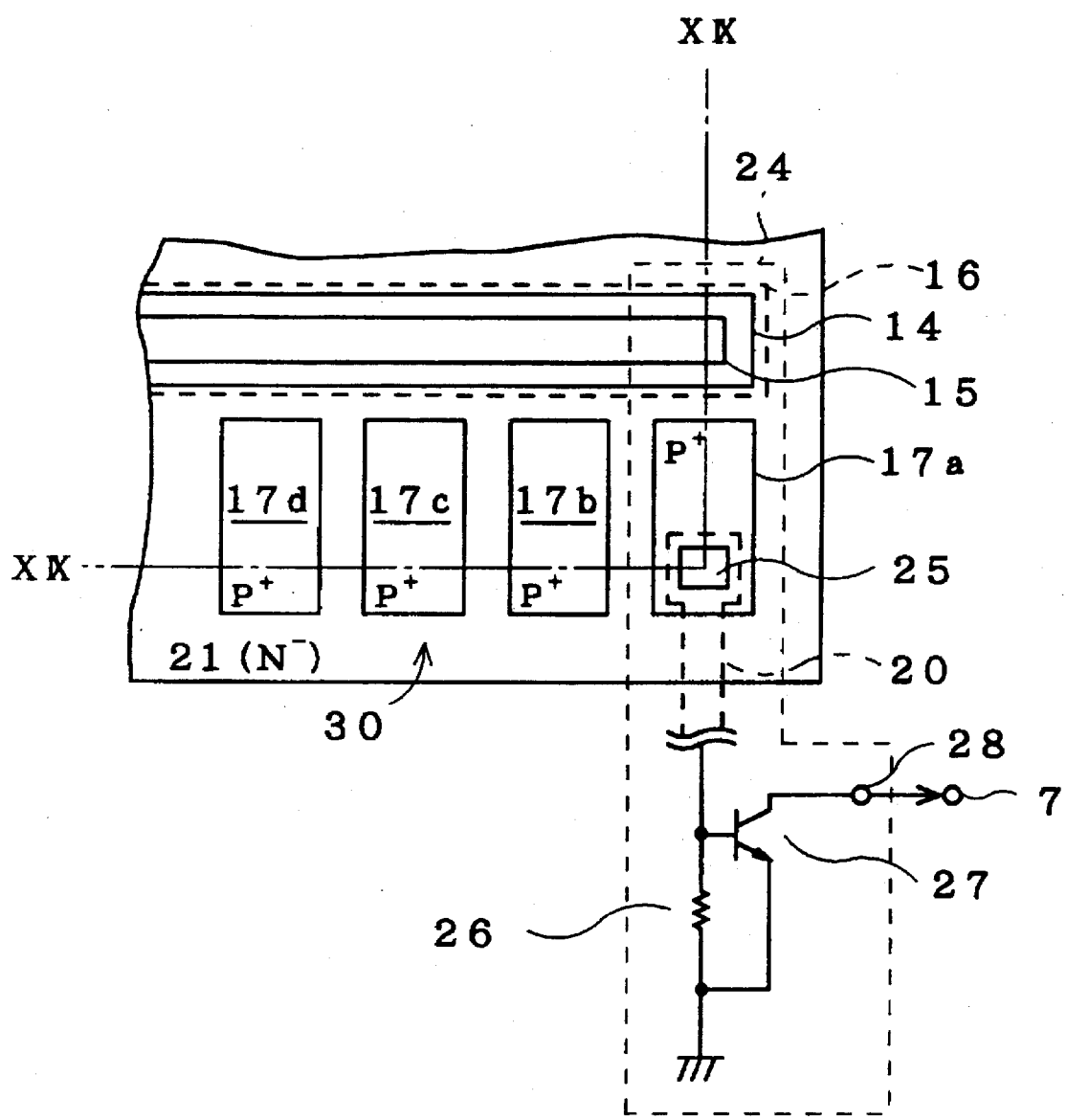
FIG. 18 is a plan view showing the fifth preferred embodiment in accordance with the present invention.
Figure 19:
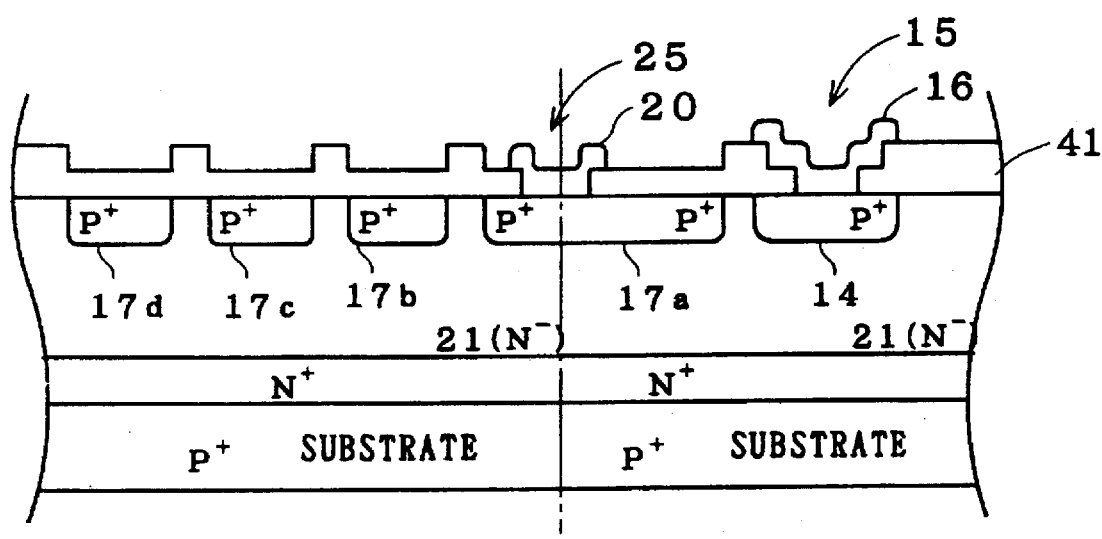
FIG. 19 is a sectional view showing the fifth preferred embodiment in accordance with the present invention.

FIG. 18 is a plan view showing a monitoring circuit 24 partially consisting of IIL elements. FIG. 19 is an enlarged sectional view taken in the section X IX—X IX of FIG. 18. In FIG. 18, the wirings 16 and 20 are represented by broken line, thereby clearly showing some parts underlaid.

The transistor 30 is not substantially different from the transistor 11 of FIG. 2. The $P^+$ diffusion regions 17a, 17b, 17c and 17d constituting the IIL element may correspond to the plurality of collectors of the transistor 30. In this case, the $P^+$ diffusion region 14 and the epitaxial $N^-$ layer 21 correspond to the emitter and base of the transistor 30, respectively.

It is determined herein that among the plurality of collectors, the injector current flowing in the $P^+$ diffusion region 17a attains the predetermined value latest. It is not necessary to provide an $N^-$ diffusion region on the main surface of the $P^+$ diffusion region 17a unlike the first preferred embodiment, because a reverse transistor is not needed. The $P^+$ diffusion region 17a is therefore connected through a contact region 25 to the wiring 20, to which the resistor 26 and the transistor 27 are connected. FIG. 19 shows a case where no wiring is connected to the $P^+$ diffusion region 17b, 17c and 17d and the collectors corresponding thereto are in open state. An $N^-$ diffusion region may be formed in the regions, to make a reverse transistor which is to be a constituent of an IIL element.

Figure 20:
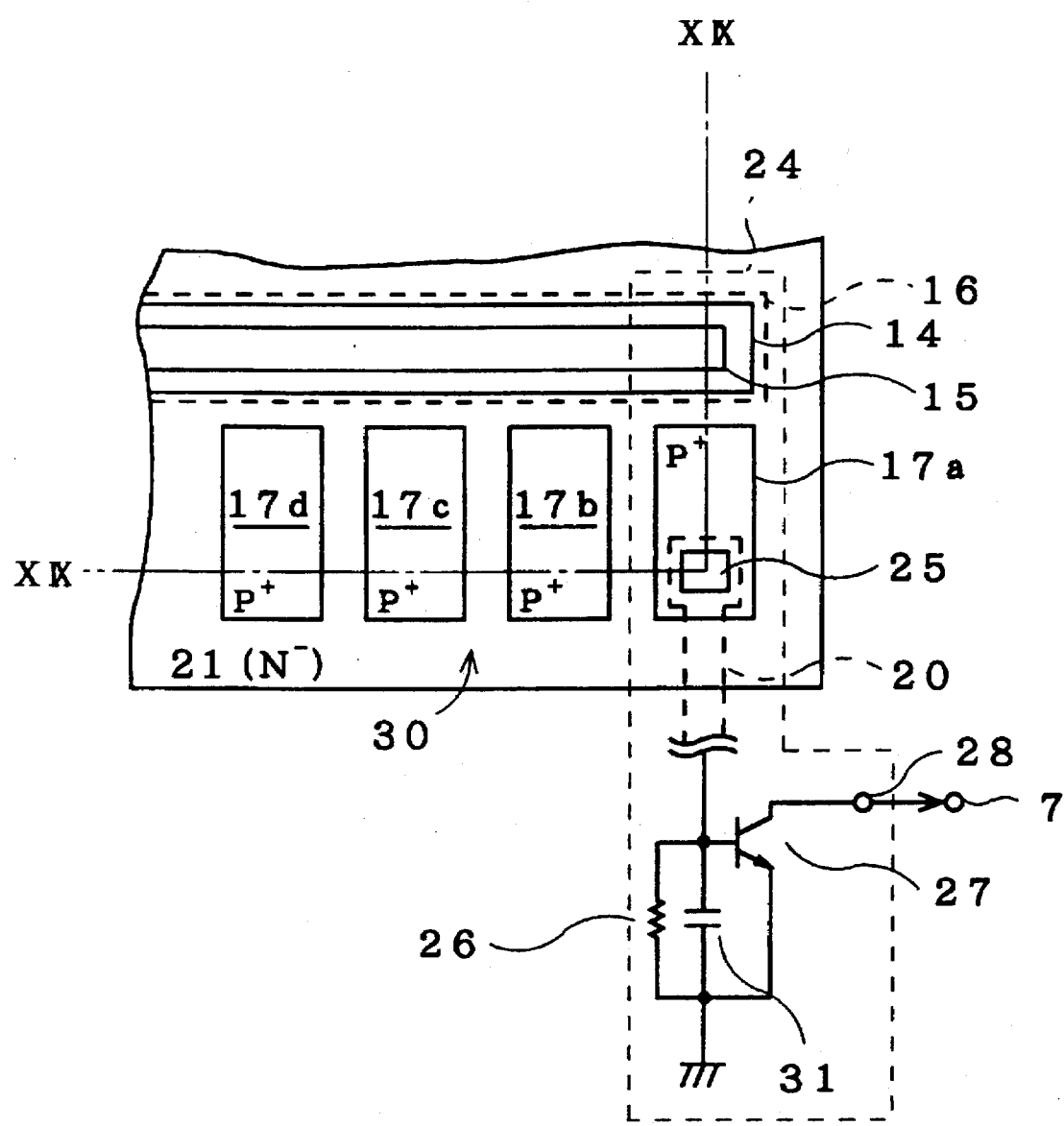
FIG. 20 is a plan view showing the fifth preferred embodiment in accordance with the present invention.
Figure 21:
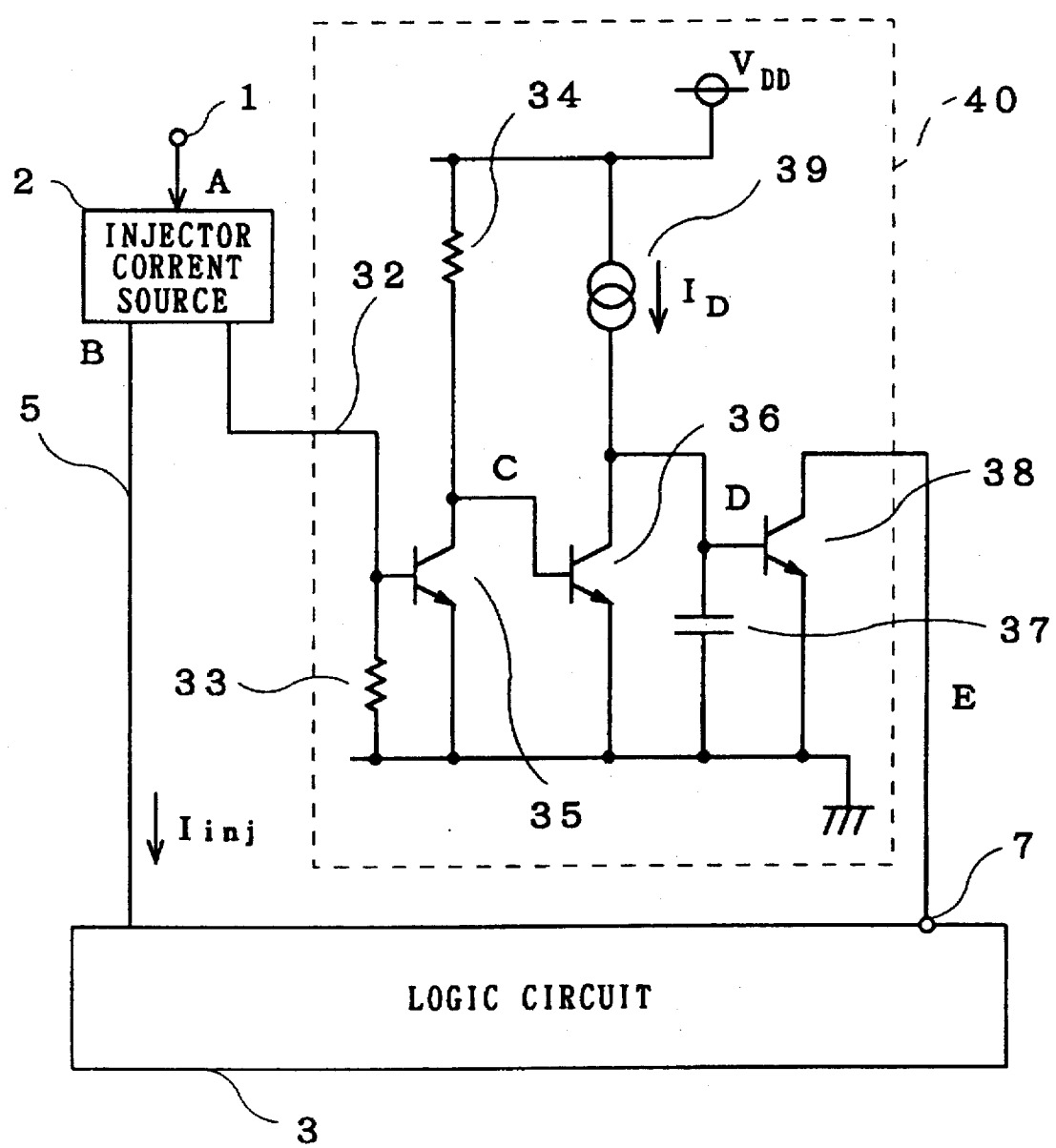
FIG. 21 is a block diagram showing a prior art technique.
Figure 22:
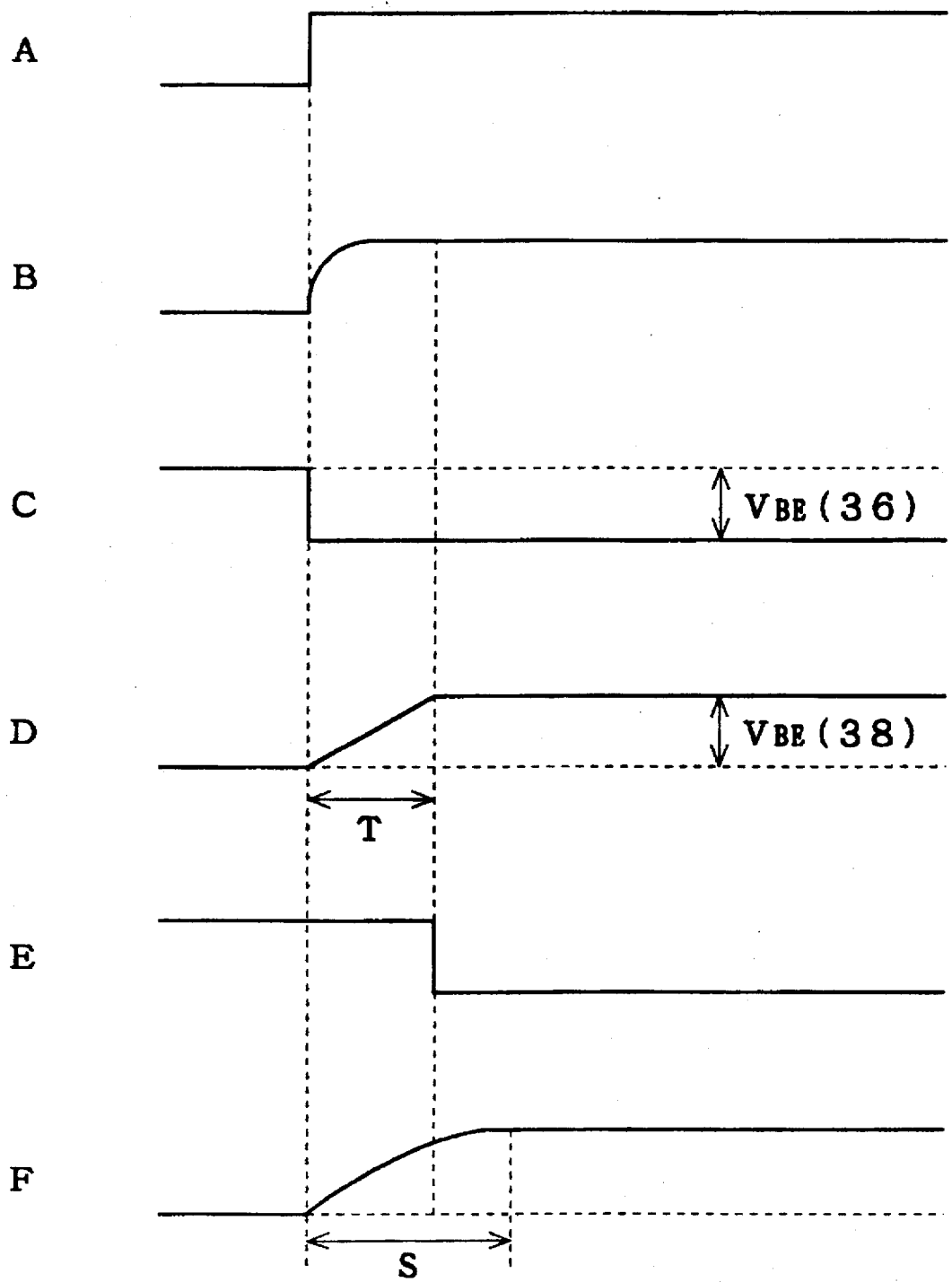
FIG. 22 shows waveform charts of a prior art technique.

Furthermore, a capacitor 31 may be provided on the same IC as the logic circuit 3, to be connected in parallel with the resistor 26 as shown in FIG. 20. It is thereby possible to make the delay time of the monitoring circuit 24 apparently longer, to obtain a longer waiting time. Therefore, the fifth preferred embodiment ensures a stable reset operation of the logic circuit 3 while achieving an improvement in the integrated circuit integration as compared with the conventional art, like the second preferred embodiment.

While the invention has been shown and described in detail, the foregoing description is in all aspects illustrative and not restrictive. It is therefore understood that numerous modifications and variations can be devised without departing the scope of the invention.

I claim:

1. A reset signal output circuit, comprising:
   (a) an injector current source for supplying a source injector current;
   (b) a logic circuit formed on diffusion regions of a first conductivity type selectively formed on a main surface of a semiconductor substrate of a second conductivity type which is complementary to the first conductivity type, having a plurality of IIL elements connected in at least one circuit, each of the plurality of IIL elements having an injector current input end to which said injector current source is connected through wiring to receive a part of said source injector current as an injector current;
   (c) a first transistor which is one of the plurality of IIL elements formed on one of said diffusion regions, having an emitter region connected to said injector current source said first transistor being a furthest one of the plurality of IIL elements from said wiring; and
   (d) an output portion for outputting a reset signal in response to conduction of said first transistor, wherein said reset signal is applied to said logic circuit.

2. The reset signal output circuit of claim 1, wherein a wiring capacity for connection between said emitter region of said first transistor and said injector current source is larger than any of wiring capacities for connection between said injector current input ends of said IIL elements constituting said logic circuit and said injector current source.

3. The reset signal output circuit of claim 1, wherein a wiring resistance for connection between said emitter region of said first transistor and said injector current source is larger than any of wiring resistances for connection between said injector current input ends of said IIL elements constituting said logic circuit and said injector current source.

4. The reset signal output circuit of claim 1, wherein said output portion further has (d-1) a second transistor which has a conductivity type complementary to that of said first transistor having a base region connected to a collector region of said first transistor and a collector region for outputting said reset signal.

5. The reset signal output circuit of claim 4, wherein said output portion further has (d-2) a capacitor connected between said base region and an emitter region of said second transistor.

6. A reset signal output circuit, comprising:
   (a) an injector current source for supplying a source injector current;
   (b) a logic circuit formed on diffusion regions of a first conductivity type selectively formed on a main surface of a semiconductor substrate of a second conductivity type which is complementary to the first conductivity type, having a plurality of IIL elements connected in at least one circuit, each of the plurality of IIL elements having an injector current input end to which said injector current source is connected through wiring to receive a part of said source injector current as an injector current;
   (c) a plurality of monitoring elements formed in a plurality of aggregates, each aggregate comprising:
      (c-1) a transistor which is one of the plurality of IIL elements formed on one of said diffusion regions, having an emitter region connected to said injector current source said transistor being a furthest one of the plurality of IIL elements from said wiring of a corresponding aggregate, and
      (c-2) an output portion for outputting a base reset signal in response to conduction of said transistor; and
   (d) an output circuit for receiving all of said base reset signals from said output portions of said plurality of monitoring elements and then outputting a reset signal, wherein
   said reset signal is applied to said logic circuit.

7. A semiconductor integrated circuit device, comprising:
   (a) an injector current source for supplying a source injector current;
   (b) a logic circuit comprising a plurality of IIL elements connected in at least one circuit, the one logic circuit including a first diffusion region of a first conductivity type selectively formed on a main surface of a semiconductor substrate of a second conductivity type which is complementary to the first conductivity type and connected to said injector current source through wiring and a plurality of second diffusion regions of the first conductivity type which are selectively formed on said main surface of said semiconductor substrate separately from said first diffusion region and each of which is disposed in parallel with one other;
   (c) a monitoring element, including:
      (c-1) a first transistor having an emitter region which is a portion of said first diffusion region, a collector region of the first conductivity type disposed on said main surface of said semiconductor substrate separately from said emitter region and in parallel with said second diffusion regions and a base region which is defined between said emitter region and said collector region on said semiconductor substrate, said first transistor being a furthest one of the plurality of IIL elements from said wiring; and (c-2) a second transistor having a collector region of the second conductivity type formed on a main surface of said collector region of said first transistor, a base region which is said collector region of said first transistor and an emitter region which is a portion of said semiconductor substrate, wherein said logic circuit is reset by a reset signal, and said monitoring element outputs said reset signal from said collector region of said second transistor.

8. A semiconductor integrated circuit device, comprising:

(a) an injector current source for supplying a source injector current;

(b) a plurality of monitoring elements, each comprising:
  (b-1) a first transistor having an emitter region formed on a main surface of a semiconductor substrate of a first conductivity type and connected to said injector current source through wiring, a collector region of a second conductivity type which is complementary to the first conductivity type formed on said main surface of said semiconductor substrate separately from said emitter region and a base region which is defined between said emitter region and said collector region on said semiconductor substrate; and
  (b-2) a second transistor having a collector region of the first conductivity type formed on said collector region of said first transistor, a base region which is said collector region of said first transistor and an emitter region which is a portion of said semiconductor substrate; and (c) a plurality of IIL elements connected in a plurality of circuits, the plurality of IIL, elements including a first diffusion region of the second conductivity type selectively formed on said main surface of said semiconductor substrate and connected to said injector current source and a plurality of second diffusion regions of the second conductivity type which are selectively formed on said main surface of said semiconductor substrate separately from said first diffusion region and each of which is disposed in parallel with one another, wherein
  (b-3) said plurality of monitoring elements each output a base reset signal from said collector region of said second transistor,
  (b-4) said first transistor of each of said plurality of monitoring elements is a furthest one of the plurality of IIL elements in a corresponding one of the plurality of circuits from said wiring,
  (c-1) a part of said plurality of IIL elements constitute an output circuit for receiving all of said base reset signals from said plurality of monitoring elements and then outputting a reset signal, and
  (c-2) the rest of said plurality of IIL elements constitute a logic circuit for being reset by said reset signal from said output circuit.

* * * * *